(12) United States Patent
Buehrer et al.

(10) Patent No.: US 7,491,563 B2
(45) Date of Patent: Feb. 17, 2009

(54) NITRIDATION OF STI FILL OXIDE TO PREVENT THE LOSS OF STI FILL OXIDE DURING MANUFACTURING PROCESS

(75) Inventors: Fred Buehrer, Poughquag, NY (US); Anthony I. Chou, Beacon, NY (US); Toshiharu Furukawa, Essex Junction, VT (US); Renee T Mo, Birarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/955,751

(22) Filed: Dec. 13, 2007

(65) Prior Publication Data
US 2008/0090379 A1 Apr. 17, 2008

Related U.S. Application Data

(62) Division of application No. 10/905,683, filed on Jan. 17, 2005.

(51) Int. Cl.
*H01L 21/00* (2006.01)
*H01L 21/76* (2006.01)

(52) U.S. Cl. .......... 438/42; 438/400; 438/404; 438/424; 438/FOR. 167; 438/FOR. 222; 257/E21.545; 257/E21.551; 257/E21.564

(58) Field of Classification Search ........... 438/42, 438/400, 404, 424, FOR. 167, FOR. 222; 257/E21.545, E21.551, E21.564
See application file for complete search history.

(56) References Cited

U.S. PATENT DOCUMENTS

| 5,316,965 | A | 5/1994 | Philipossian et al. |
|---|---|---|---|
| 5,811,347 | A | 9/1998 | Gardmer et al. |
| 6,100,160 | A * | 8/2000 | Hames ............. 438/424 |
| 6,146,970 | A | 11/2000 | Witek et al. |
| 6,352,906 | B1 | 3/2002 | Leobandung |
| 6,498,383 | B2 | 12/2002 | Beyer et al. |
| 6,723,663 | B1 | 4/2004 | Wieczorek et al. |
| 6,744,113 | B2 | 6/2004 | Kuroi et al. |
| 6,759,302 | B1 | 7/2004 | Chen et al. |
| 6,812,159 | B2 | 11/2004 | Wieczorek et al. |

* cited by examiner

*Primary Examiner*—Thanh V Pham
(74) *Attorney, Agent, or Firm*—Gibb & Rahman, LLC; Todd M. C. Li, Esq.

(57) ABSTRACT

A method and structure for an improved shallow trench isolation (STI) structure for a semiconductor device. The STI structure incorporates an oxynitride top layer of the STI fill. Optionally, the STI structure incorporates an oxynitride margin of the STI fill adjacent the silicon trench walls. A region of the oxynitride margin near the upper edges of the silicon trench walls includes oxynitride corners that are relatively thicker and contain a higher concentration of nitrogen as compared to the other regions of the oxynitride margin. The oxynitride features limit the STI fill height loss and also reduce the formation of divots in the STI fill below the level of the silicon substrate cause by hydrofluoric acid etching and other fabrication processes. Limiting STI fill height loss and the formation of divots improves the functions of the STI structure. The method of forming the STI structure is particularly compatible with standard semiconductor device fabrication processes, including chemical mechanical polishing (CMP), because the method incorporates the use of a pure silicon dioxide STI fill and plasma and thermal nitridation processes to form the oxynitride top layer and oxynitride margin, including the oxynitride corners, of the STI fill.

11 Claims, 20 Drawing Sheets

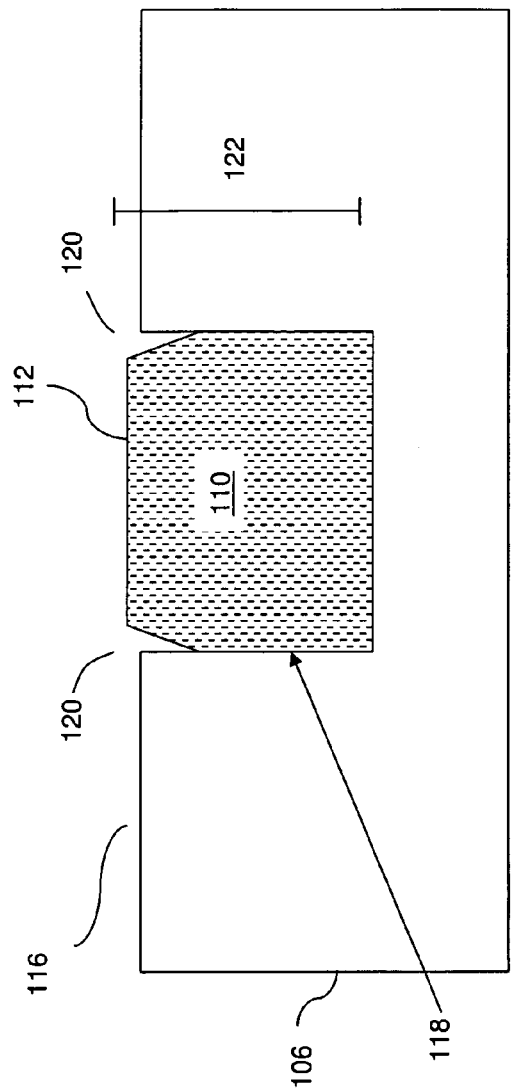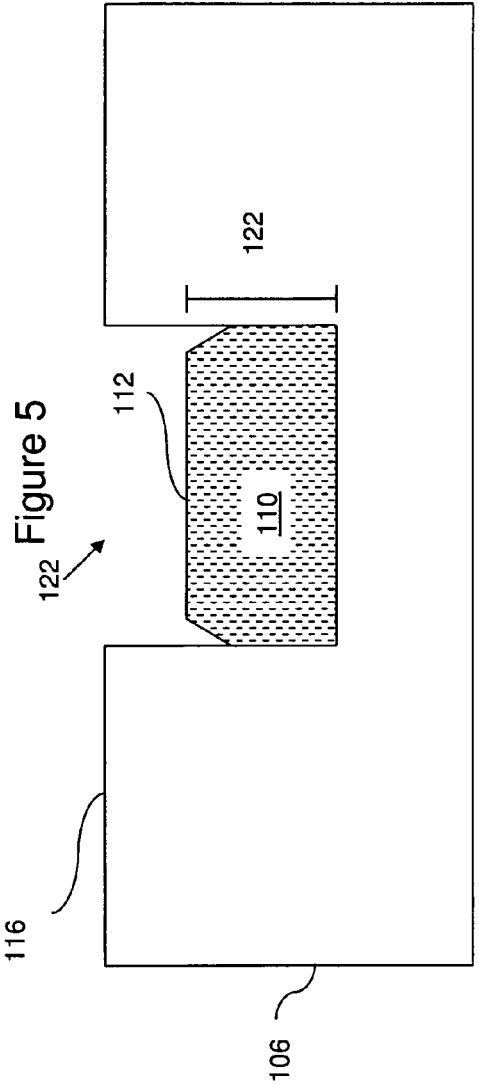
Figure 5 PRIOR ART
Figure 6 PRIOR ART

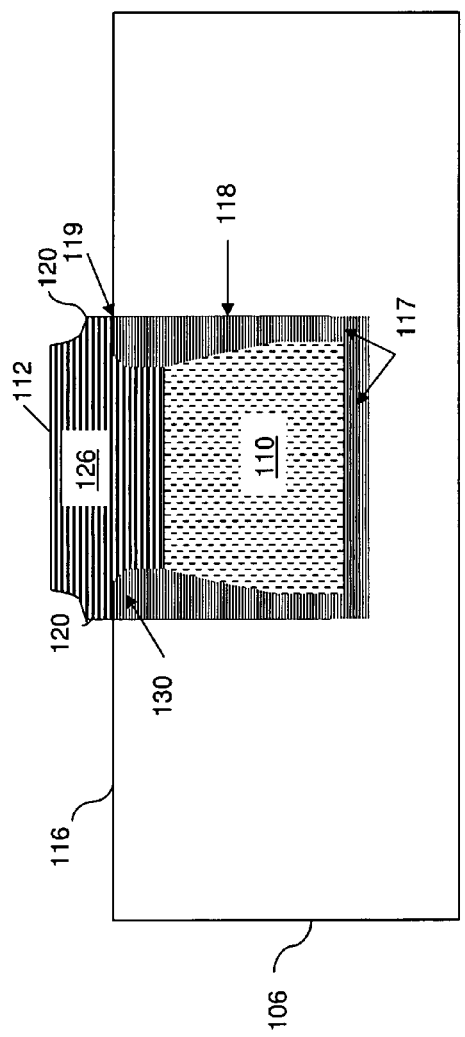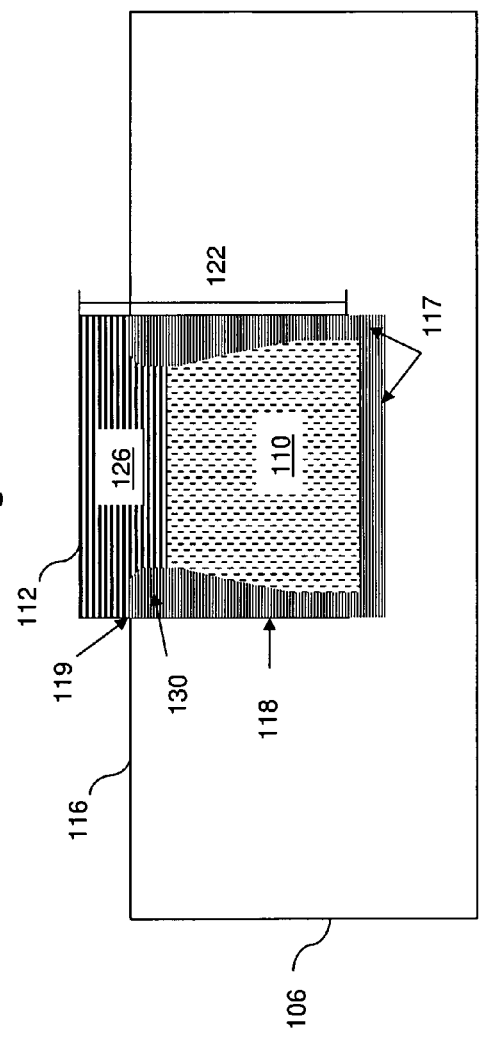

NITRIDATION OF STI FILL OXIDE TO PREVENT THE LOSS OF STI FILL OXIDE DURING MANUFACTURING PROCESS

CROSS-REFERENCE TO RELATED APPLICATIONS

This application is a division of U.S. patent application Ser. No. 10/905,683, filed Jan. 17, 2005.

BACKGROUND OF THE INVENTION

1. Field of the Invention

The present invention relates generally to a shallow trench isolation (STI) structure of a semiconductor device and method for forming an improved shallow trench isolation structure incorporating a pure silicon dioxide STI fill with an oxynitride top layer.

2. Description of the Related Art

Shallow Trench Isolation (STI) is used to electrically isolate semiconductor devices that make up an integrated circuit (IC). STI minimizes unwanted current leakage between the semiconductor devices, which can affect the performance of each semiconductor device. Generally, STI structures are formed by etching trenches into a silicon substrate. These trenches are then filled with an insulating dielectric STI fill such as, silicon dioxide (SiO2). The STI structures are formed early in the semiconductor-integrated circuit fabrication process flow. Therefore, the STI fill is exposed to many additional fabrication processes. These additional fabrication processes include many exposures to hydrofluoric acid (HF). The HF is used to etch away unwanted material, such as silicon dioxide, from exposed surfaces. However, in addition to etching away unwanted material, the HF also erodes away silicon dioxide STI fill. The erosion of the STI silicon dioxide fill occurs in two ways. First, the HF can decrease the overall height of the STI silicon dioxide fill. Second, the HF erodes more STI silicon dioxide fill from around the edges of the top surface of the STI fill. This increased erosion around the edges of the top surface of the STI fill results in the formation of a "divot" between the edges of the top surface of the STI fill and the top surface of the silicon trench walls. The reduction in the overall height of the STI fill and the formation of a divot around the edges of the top surface of the STI fill reduces the effectiveness of the STI structure and can result in a variety of possible circuit failures and/or changes in performance.

One method of minimizing the loss (i.e., erosion) of the STI silicon dioxide fill is to reduce the amount of HF exposure to the minimum amount necessary to achieve a robust integrated circuit fabrication process. However, if HF exposure is already minimized and the erosion still occurs, changes may be made to the STI structure. For example, the composition of the STI fill may be changed to include a dielectric other than pure silicon dioxide in order to reduce the etch rate of the HF. Oxynitride films (e.g., SiOxNy) etch more slowly in HF than $SiO_2$, so methods to create oxynitride features in an STI structure can reduce STI fill height loss and divot formation. Nitrogen ion implantation into the STI silicon dioxide fill is one method of creating an oxynitride (see U.S. Pat. No. 5,316,965 issued to Philipossian et al. on May 31, 1994 and incorporated herein by reference). However, because of the relatively high energy and dose of this implant, the resulting implant damage can actually result in an increased etching rate. Thermal Nitridation of the STI silicon dioxide fill is another method of including an oxynitride in the STI structure (see U.S. Pat. No. 5,811,347 issued to Gardner et al. on Sep. 22, 1998 and incorporated herein by reference). Thermal nitridation is accomplished by exposing a semiconductor wafer to a nitrogen containing gas such as, ammonia (NH3), nitric oxide (NO), or nitrous oxide ($N_2O$), at high temperatures. However, this type of nitridation results in nitrogen incorporation primarily at the silicon trench wall and STI silicon dioxide fill interfaces to form an oxynitride trench liner, which does not protect the top portion of the STI fill from erosion. Another method of including an oxynitride in the STI structure is by directly depositing an oxynitride film into the STI trenches (see U.S. Pat. No. 6,498,383 issued to Beyer et al. on Dec. 24, 2002 and incorporated herein by reference). However, since most common STI fabrication processes are optimized for conformal deposition and chemical mechanical polishing (CMP) of pure silicon dioxide, directly depositing an oxynitride in the STI structure can be problematic in terms of the fill properties and polishing characteristics. Specifically, depositing an oxynitride into the STI trench, as opposed to pure silicon dioxide, may interfere with the chemical mechanical polishing (CMP) process used to remove excess STI fill oxide and to planarize the STI fill (e.g., such that it is approximately level with the pad nitride). The invention described below addresses these issues by providing an STI structure, and a method for forming the STI structure, in which a pure silicon dioxide material is used to fill the shallow trench structure in order to facilitate polishing and in which the upper portion of the silicon dioxide fill, and optionally, the upper STI fill margins, where the silicon dioxide STI fill and the upper edges of the silicon trench walls meet, are doped with nitrogen to prevent erosion.

SUMMARY OF THE INVENTION

This disclosure presents a shallow trench isolation structure (STI) for a semiconductor device. Specifically, it presents an improved shallow trench isolation structure comprising a pure silicon dioxide STI fill with an oxynitride top layer and, optionally, incorporates additional nitrogen in the region of the upper STI fill margins, where the silicon dioxide STI fill and the upper edges of the silicon trench walls meet (i.e., oxynitride STI fill margins).

In embodiments of this structure, a pure silicon dioxide-filled isolation trench is formed in a silicon layer of a silicon-on-insulator (SOI) or bulk substrate. The upper portion of the silicon dioxide fill undergoes a plasma nitridation process to form an oxynitride top layer. The oxynitride top layer of the STI fill extends both above and below the level of the top surface of the silicon layer. The oxynitride top layer of the STI fill reduces the erosion of the STI fill caused by further processing of the semiconductor device. Optionally, the STI fill is thermally nitridized after the plasma nitridation process to incorporate additional nitrogen into the STI fill margins and, particularly, in the region of the STI fill margins where the silicon dioxide STI fill and the upper edges of the silicon trench walls meet to form oxynitride STI fill corners. The oxynitride STI fill corners significantly reduces formation of divots.

This disclosure also presents a method of forming the shallow trench isolation structure, as described above. A multi-layered stack is formed comprising a pad nitride layer on a pad oxide layer on a silicon substrate layer (e.g., either an SOI substrate or a bulk substrate). A patterned photo-resist layer is formed on the pad nitride layer using a photolithography pattern in order to create a window defining the STI structure location. Then, using a reactive ion etching (RIE) process, a shallow isolation trench is etched through the window, nitride and pad oxide layers, and into the silicon layer. After the photo-resist layer is removed, the exposed silicon surface in the trench is thermally oxidized to passivate the surface. Silicon dioxide is deposited over the pad nitride layer and into the shallow isolation trench by chemical vapor deposition (CVD). Then, the silicon dioxide is planarized by CMP, so that the silicon dioxide fill in the shallow isolation trench is approximately level with the top surface of the pad nitride layer. Optionally, HF etching can be performed to adjust the STI fill height and also to remove any residual STI fill oxide on the pad nitride layer. At this point, the top surface of the wafer and particularly the STI fill oxide is subjected to nitrogen plasma to nitridize the top portion of the STI fill oxide to form an oxynitride top layer. The pad nitride layer and the pad oxide layer prevent nitridation of the silicon surface in device area of the wafer. After the plasma nitridation process, thermal anneal is performed to complete the nitridation of STI fill oxide and also to remove any damages created during the plasma nitridation process. The thermal anneal may be performed in NH3, NO, or $N_2O$ ambient to incorporate additional nitrogen (i.e., by thermal nitridation) into the STI fill margins adjacent the silicon trench walls and, particularly, into the region of the STI fill margins where the silicon dioxide STI fill and the upper edges of the silicon trench walls meet to form oxynitride STI fill corners. The pad nitride and the pad oxide are then etched off to complete the STI fabrication process. Optionally, the pad nitride layer and the pad oxide layer may be removed before the plasma nitridation process. However, the silicon surface will also be nitridized during the plasma nitridation process and some of nitrogen may be incorporated in the gate dielectric during a gate oxidation process. The oxynitride STI fill top layer formed by the plasma nitridation process and subsequent thermal anneal is effective at minimizing overall STI fill erosion caused by various fabrication processing steps for forming semiconductor device. The additional nitrogen incorporation into the STI fill margins adjacent the silicon trench walls and, particularly, into the region of the STI fill margins where the silicon dioxide STI fill and the upper edges of the silicon trench walls meet to form oxynitride STI fill corners reduces the formation of divots.

These, and other, aspects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 5-6 are schematic cross-sectional view diagrams of completed STI structures following hydrofluoric acid (HF) etching processes;

FIG. 19$b$ is a schematic cross-sectional nitrogen concentration profile;

DETAILED DESCRIPTION OF PREFERRED EMBODIMENTS OF THE INVENTION

Figure 1:
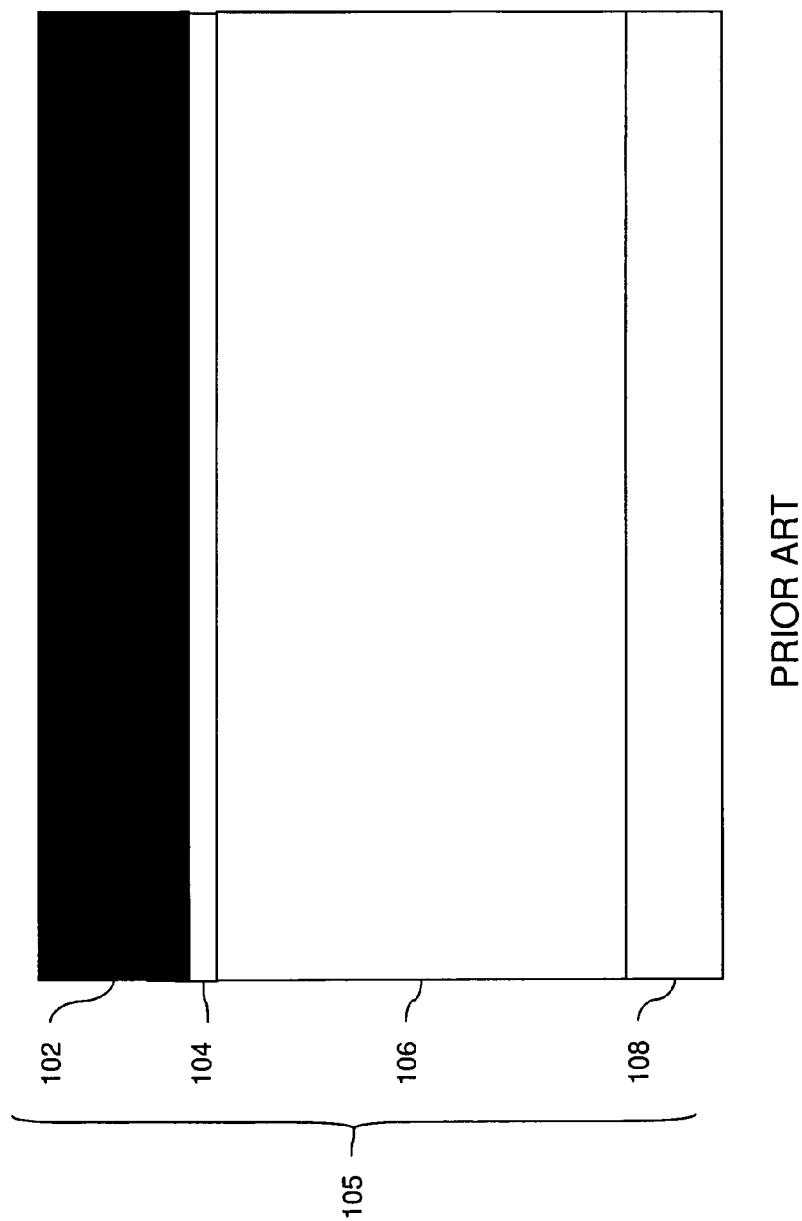
FIG. 1 is a schematic diagram cross-sectional view diagram of a partially completed shallow trench isolation structure.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Referring to FIGS. 1-6 in combination, conventional shallow trench isolation (STI) structures are formed by etching trenches 136 of a depth of approximately 10-700 nm (shallower for SOI substrates and deeper for bulk substrates) through a multi-layered stack 105 (e.g., an approximately 5-200 nm thick pad nitride 102 on an approximately 5-50 nm thick pad oxide 104 on a silicon substrate 106 on a buried oxide (BOX) 108, etc. (see FIG. 1) and extending into the silicon substrate 106 in order to separate semiconductor device active areas. The pad nitride layer 102 protects the underlying layers, during various process steps used to form the STI structures (see FIG. 1). After the removal of photoresist, the exposed silicon surfaces are thermally oxidized to form 1-10 nm thick silicon dioxide layer. The trenches 136 are filled with an insulating dielectric (i.e., STI fill 110), specifically, silicon dioxide (SiO2) (see FIG. 2). The STI fill 110 deposition thickness may vary and can be approximately 20-1000 nm. Using conventional methods for forming the STI structures, a chemical mechanical planarization (CMP) process is used to level the top surface 112 of the STI fill 110 with the top surface 114 of the pad nitride 102 (see FIG. 3). A high temperature thermal anneal can be performed to increase the density of the STI fill oxide 110. Also, optionally, HF etching can be performed to adjust the STI fill 110 height and to remove any residual STI fill oxide on top of the pad nitride 102. The pad nitride 102 is then stripped from the pad oxide 104 using a hot solution of phosphoric acid. The pad oxide 104 is also stripped away from the silicon substrate 106 often with a hydrofluoric acid (HF). Ideally, referring to FIG. 4, the resulting STI structure comprises a complete STI fill 110 having an upper portion 112 that extends slightly above the top surface 116 of the exposed silicon substrate 106. However, because the STI structures are formed early in the semiconductor device fabrication process flow and the STI fill 110 is exposed to many additional fabrication processes, the resulting STI fill 110 is often not complete. For example, when HF is used to etch away the pad oxide 104, the HF also erodes away the STI silicon dioxide fill 110.

Referring to FIGS. 5-6, the final shape of the STI structure depends on the starting height of the STI fill 110 relative to the silicon substrate 106, the specific integration, and the amount of HF exposure. As illustrated in FIG. 6, the HF can decrease the overall height 122 of the STI silicon dioxide fill 110. As illustrated in FIG. 5, once the pad nitride 102 is removed, the HF etch process can erode more STI silicon dioxide fill 110 from around the edges of the top surface 112 of the STI fill 110. This increased erosion around the edges of the top surface 112 of the STI fill 110 results in the formation of a "divot" 120 between the edges of the top surface 112 of the STI fill 110 and the edges on the top surface 116 of the silicon substrate 106 correspond to the silicon trench walls 118. The reduction in the overall height 122 of the STI fill 110 and the formation of a divot 120 around the edges of the top surface 112 of the STI fill 110 reduces the effectiveness of the STI structure and can result in defect formation.

Thus, the invention provides an improved shallow trench isolation structure (STI) for a semiconductor device. Specifically, it presents an improved shallow trench isolation structure comprising a pure silicon dioxide STI fill with an oxynitride top layer formed by a plasma nitridation process and thermal anneal and, optionally, incorporates additional nitrogen (e.g., by thermal NO, NH$_3$ or N$_2$O nitridation) into the STI fill margins adjacent the silicon trench walls and, particularly, into the region of the STI fill margins where the silicon dioxide STI fill and the upper edges of the silicon trench walls meet to form oxynitride STI fill corners. The oxynitrides, so positioned, limit STI fill height loss and also reduce the formation of divots in the STI fill below the level of the top surface of the silicon substrate caused by HF etching and other fabrication process. Limiting STI fill height loss and the formation of divots improves the functions of the STI structure and the process yield. The method of forming the STI structure is compatible with standard fabrication processes, particularly with chemical mechanical polishing (CMP), because it incorporates the use of a pure silicon dioxide STI fill and a plasma nitridatiton of the top layer of the STI fill after CMP.

Figure 10:
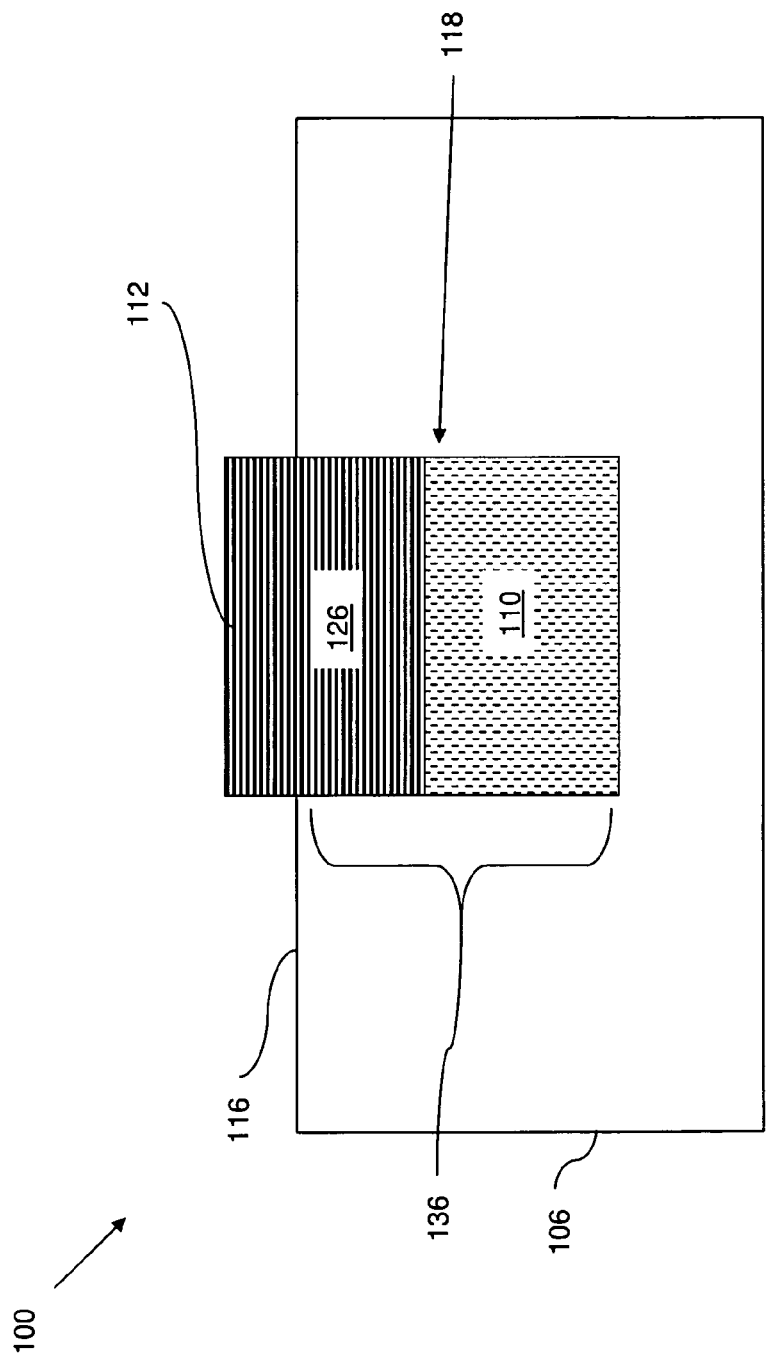
FIG. 10 is a schematic cross-sectional view diagram of a completed STI structure.
Figure 18:
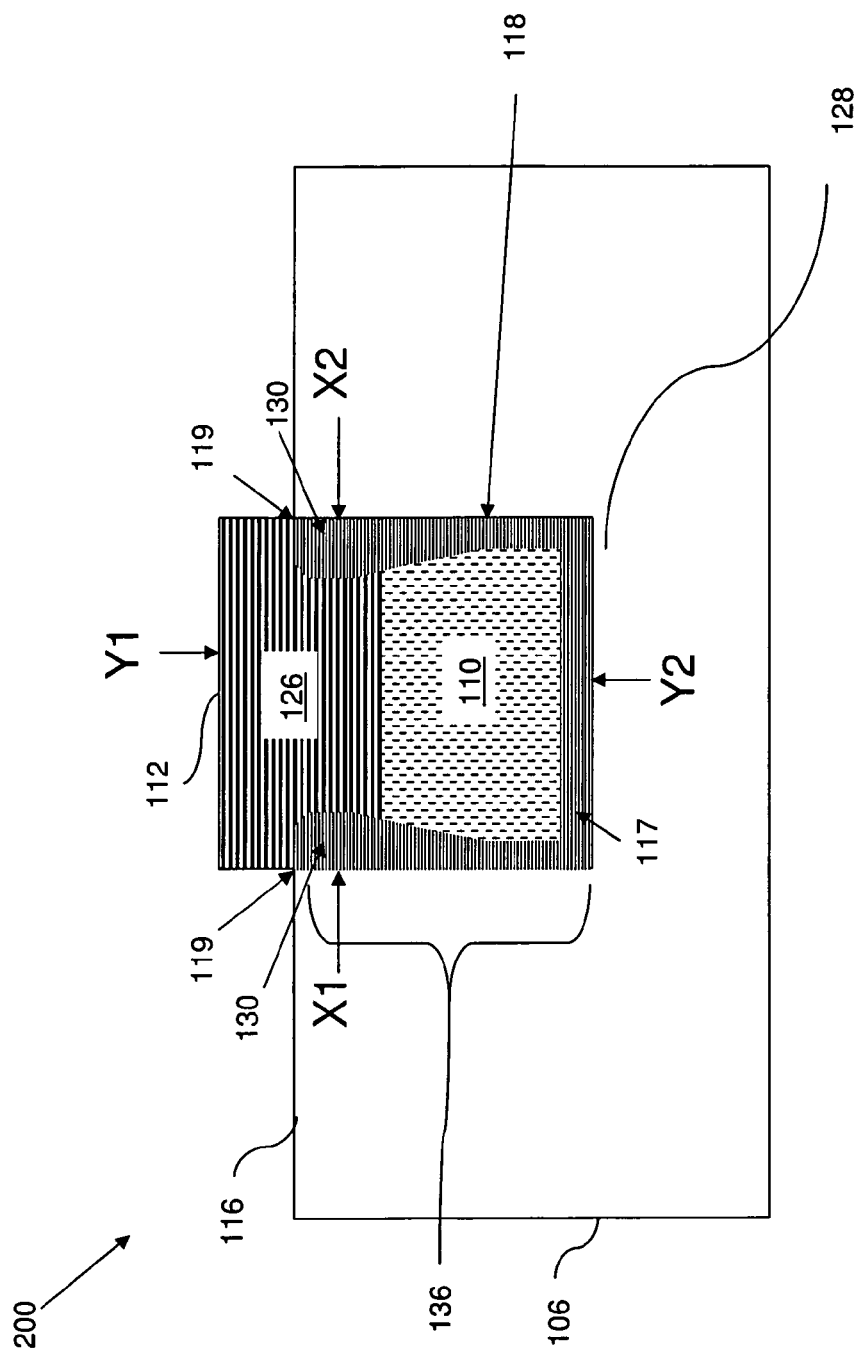
FIG. 18 is a schematic cross-sectional view diagram of a completed STI structure.

Referring to FIGS. 10 and 18, embodiments of the present semiconductor device shallow trench isolation structure 100, 200, as illustrated in FIGS. 10 and 18, respectively, comprises an isolation trench 136 incorporating a pure silicon dioxide fill (STI fill 110) having an oxynitride STI fill top layer 126 and, optionally, oxynitride STI fill corners 130, in the region where the STI fill oxide 110 and the upper edges 119 of the silicon trench walls 118 meet (see FIG. 18). These oxynitride features 126, 130 of the STI structures 100, 200 effectively reduce the erosion of the STI fill oxide 110. An isolation trench 136 is formed in a silicon layer 106 of a silicon-on-insulator (SOI) or bulk substrate structure 106. The isolation trench 136 is filled with a pure silicon dioxide fill (i.e., STI fill 110) and the top surface 112 of the STI fill 110 undergoes a plasma nitridation process that incorporates nitrogen into the upper portion of the STI fill oxide 110 to form an oxynitride STI fill top layer 126. The depth of the nitridized STI fill top layer 126 is such that the oxynitride extends both above and below the level of the top surface 116 of the silicon layer 106. Additionally, as shown in the structure 200 of FIG. 18, nitrogen is incorporated into the STI fill margins 117 adjacent the silicon trench walls 118 and, particularly, into the region of the STI fill margins 117 where the silicon dioxide STI fill 110 and the upper edges 119 of the silicon trench walls 118 meet to form oxynitride STI fill corners 130. Due to the thermal nitridation process (e.g., a 800 C-1000 C thermal anneal with NO, NH$_3$ or N$_2$O gas applied to the STI fill 110 after the plasma nitridation process), the oxynitride STI fill corners 130 are thicker and contain a higher concentration of nitrogen relative to the STI fill margins 117 lower in the STI trench 136. Both the oxynitride STI fill top layer 126 alone and the oxynitride STI fill corners 130 are effective at preventing erosion of the STI fill 110, including the loss of STI fill height 122 and divot 120 formation caused by further processing of the semiconductor device (see FIGS. 5-6).

Figure 2:
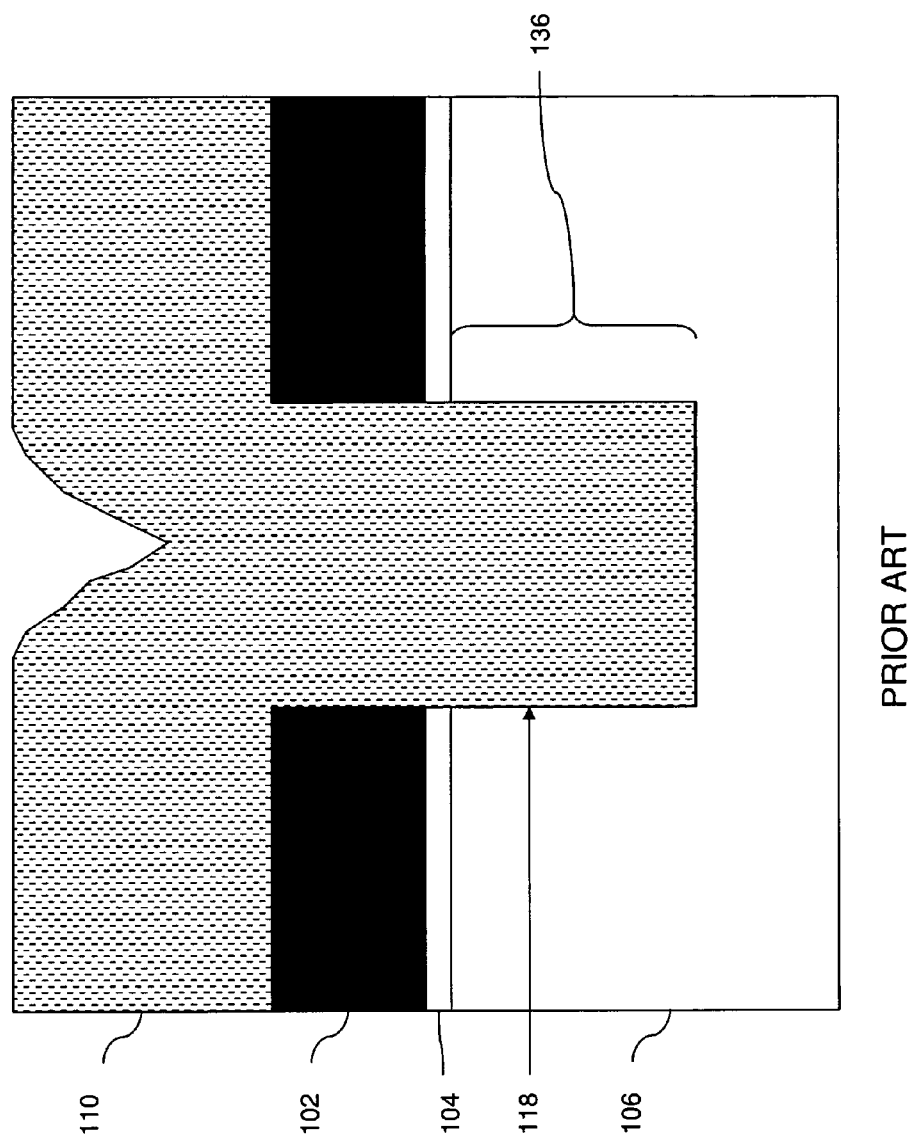
FIG. 2 is a schematic cross-sectional view diagram of a partially completed STI structure.
Figure 3:
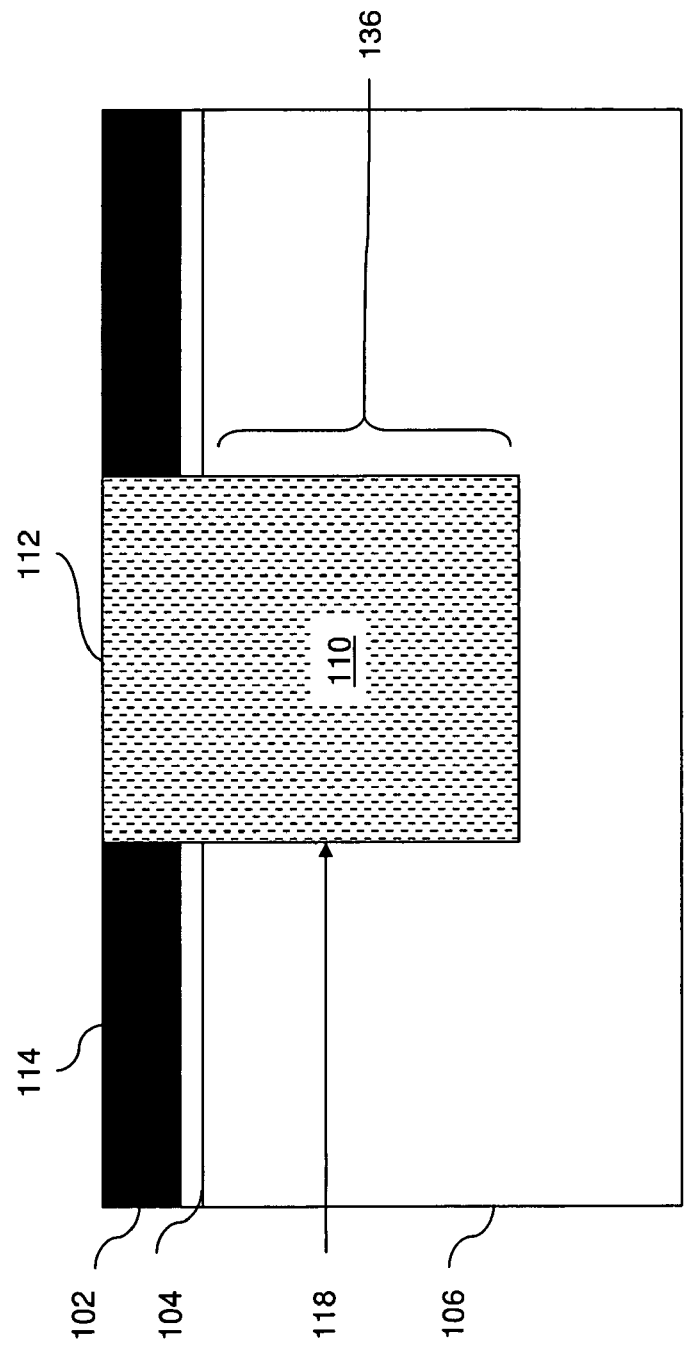
FIG. 3 is a schematic cross-sectional view diagram of a partially completed STI structure.
Figure 4:
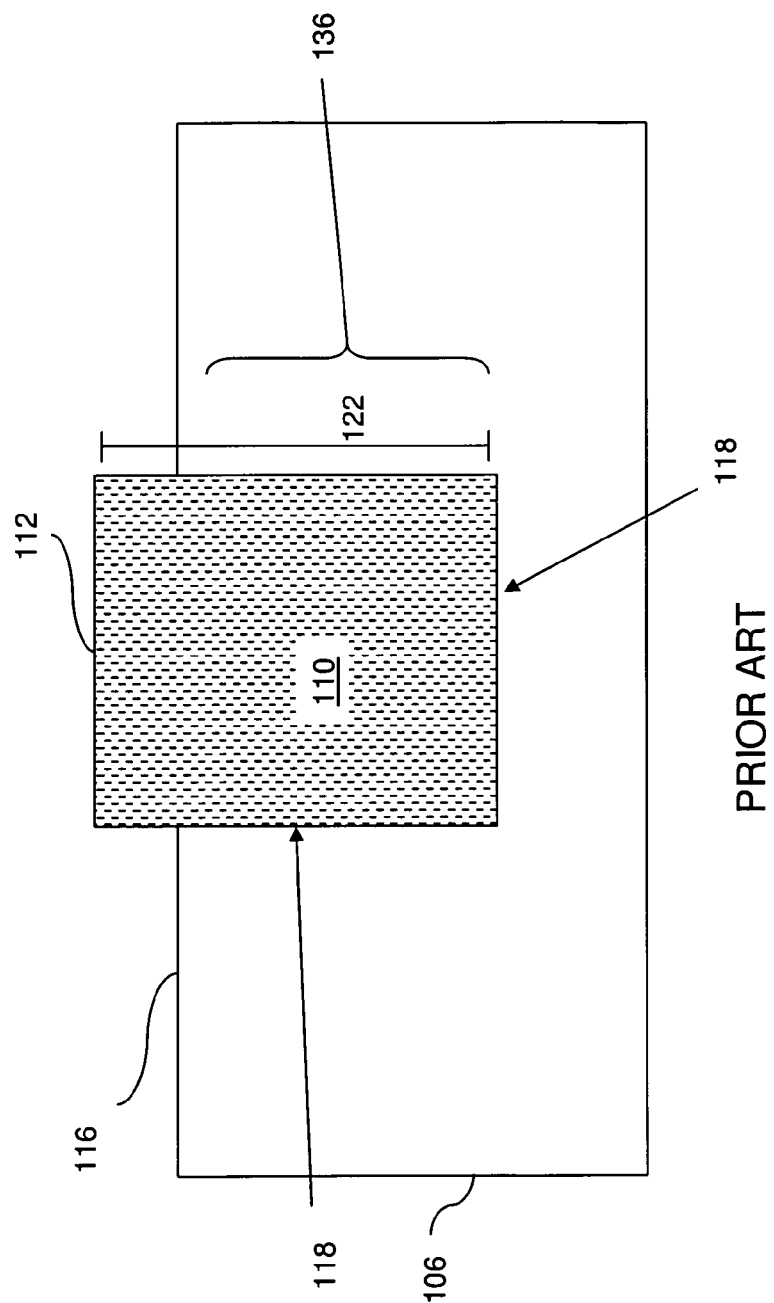
FIG. 4 is a schematic cross-sectional view diagram of a partially completed STI structure.

Referring to FIGS. 1-4, in each embodiment of the method, an isolation trench 136 is formed in a multi-layered stack 150, wherein the multi-layered stack 150 comprises a pad nitride layer 102 on a pad oxide layer 104 on a silicon substrate 106 on a buried oxide layer 108. The trench 136 comprises silicon trench walls 118 and is filled with a silicon dioxide fill 110. Specifically, referring to FIG. 1, the process of forming the silicon dioxide-filled trench includes forming the multi-layered stack 105. A silicon substrate 106 (e.g., SOI substrate or bulk substrate) is formed on a buried oxide layer 108. A pad oxide layer 104 is grown on top of the silicon substrate 106. A pad nitride layer 102 is then deposited on top of the pad oxide 104. A patterned photo-resist layer is formed on the pad nitride layer 102, using a photolithography pattern in order to create a window defining the STI structure location. Then, using a reactive ion etching (RIE) process shallow isolation trench 136 is etched through the window, nitride and pad oxide layers 102, 104 and into the silicon substrate 106. Once the trench 136 is etched, the photo-resist layer is removed. After stripping the photo-resist, the exposed silicon surfaces in the trench 136 are thermally oxidized to form 1-10 nm silicon dioxide. The oxidation passivates the silicon surface (i.e., reduces the surface defects by making it inactive or less reactive). Referring to FIG. 2, a pure silicon dioxide STI fill 110 of appropriate thickness (e.g., approximately 20-1000 nm) is then deposited over the pad nitride layer 102 to completely fill the entire trench 136 (see FIG. 2). Referring to FIG. 3, once the trench 136 is filled with the silicon dioxide STI fill 110, a chemical mechanical polishing (CMP) process is performed to remove the excess silicon dioxide that is deposited on top of the pad nitride 102 such that the top surface 112 of the STI fill 110 is level with the top surface 114 of the pad nitride layer 102. The pad nitride layer 102 serves as a stopping layer during the CMP process. An optional process includes using hydrofluoric acid HF or another etchant to remove any residual silicon dioxide from the pad nitride layer top surface 114 to prepare for the pad nitride layer 102 removal process (discussed below) and also to adjust the STI fill oxide height 122.

Figure 9:
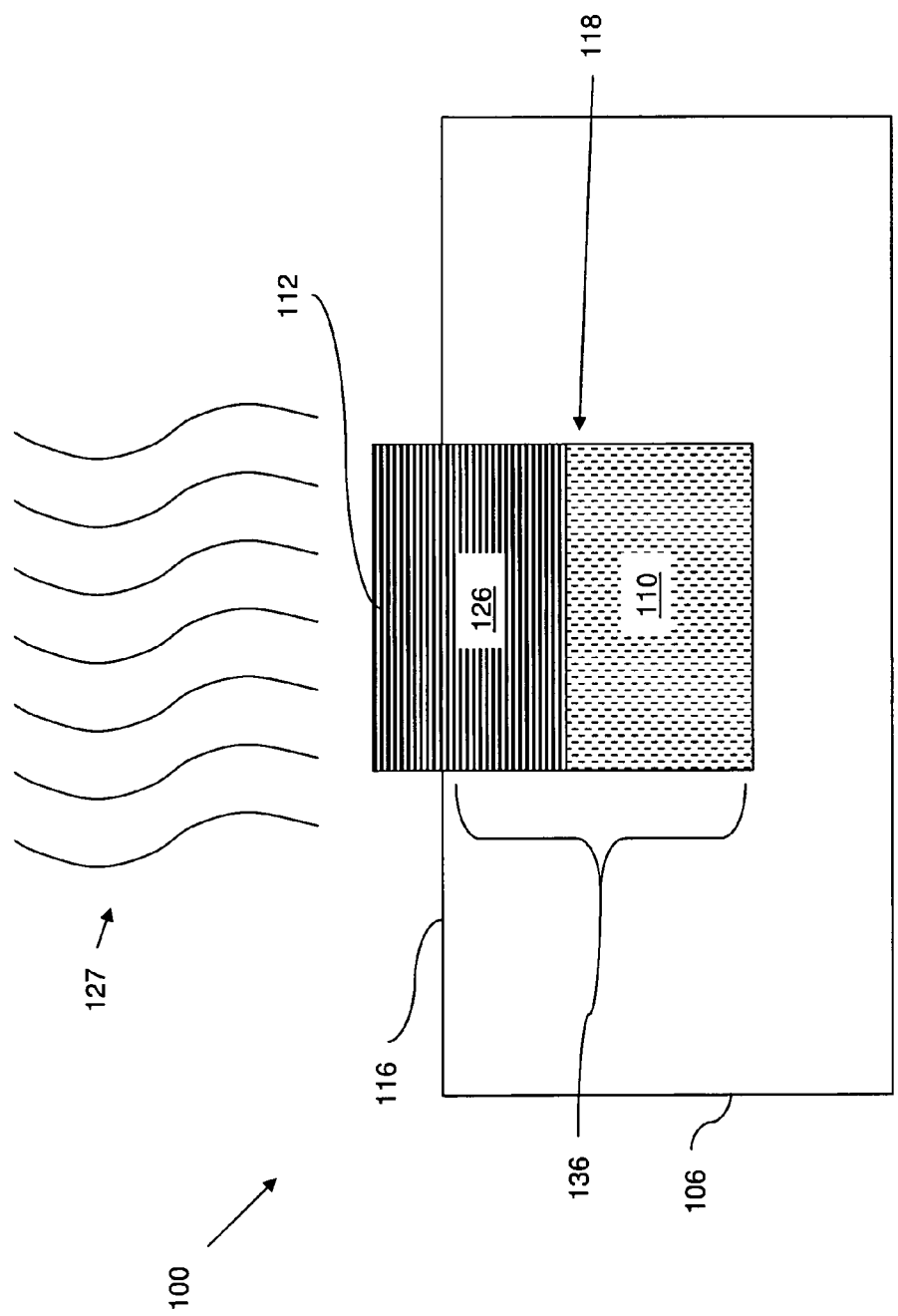
FIG. 9 is a schematic cross-sectional view diagram of a partially completed STI structure.

After forming the preliminary STI structure of FIG. 3, the method of forming a shallow trench isolation structure of the present invention with the oyxnitride STI fill oxide features (e.g., oxynitride top layer 126 (see FIG. 10) and, optionally, oxynitride corners 130 (see FIG. 18)) can be accomplished according to alternative method embodiments. There are three alternative method embodiments for forming an STI structure 100 (see FIG. 10) in which primarily the top surface 112 of the STI fill 110 is subjected to a plasma nitridation process to form an oxynitride STI fill top layer 126 in the upper portion of the STI fill 110. The differences between these embodiments reflect different sequences by which the method processes are performed. Once the plasma nitridation process 124 is performed, the nitridation process should be completed with a high temperature thermal anneal 127 (see FIG. 9, discussed below) to form the completed STI structure 100 of FIG. 10. This thermal anneal 127 will also repair plasma damages. There is an additional method embodiment for forming an STI structure 200 (see FIG. 18) in which a thermal nitridation process 128 is performed in addition to the plasma nitridation process 124. The thermal nitridation process 128 is performed in order to form oxynitride STI fill margins 117 and, particularly, to form oxynitride STI fill corners 130 in the region of the STI fill margins 117 adjacent the upper edges 119 of the silicon trench walls 118. The oxynitride STI fill corners 130 are formed such that they are thicker and contain a higher concentration of nitrogen as compared to the other regions of the STI fill margins 117.

Figure 7:
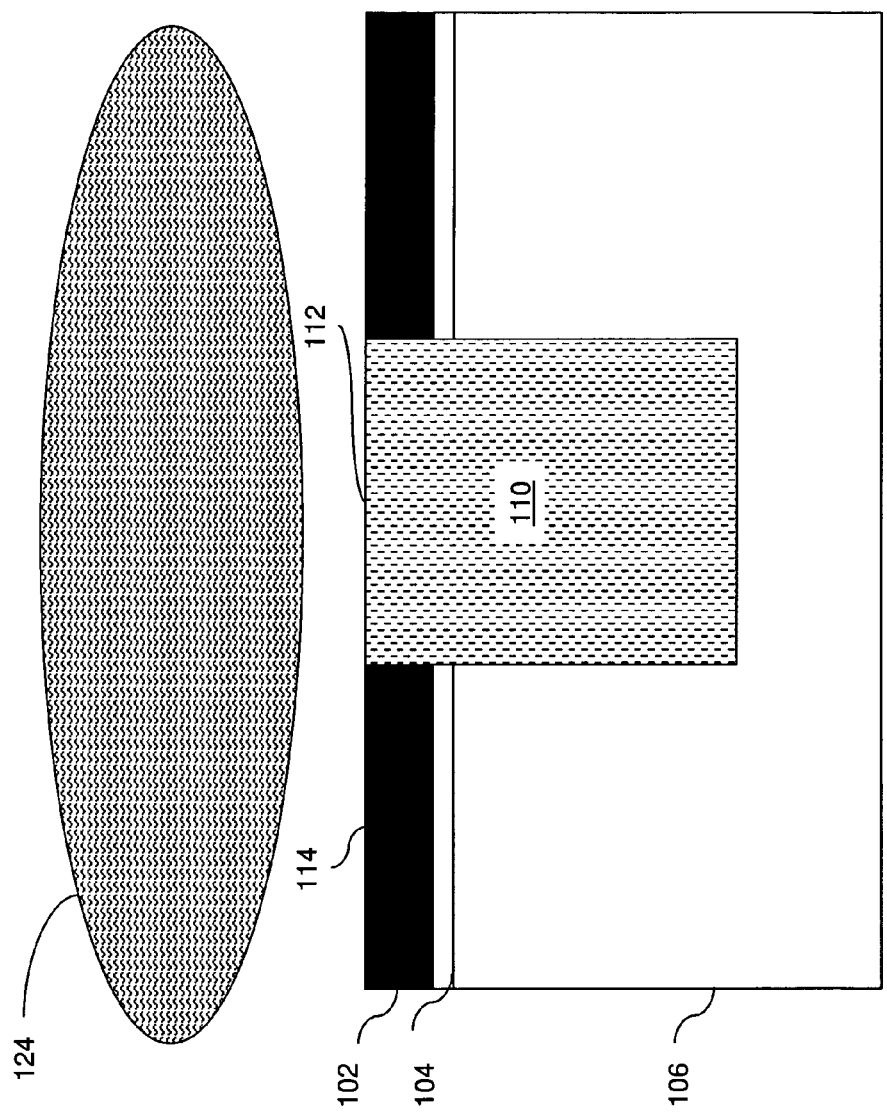
FIG. 7 is a schematic cross-sectional view diagram of a partially completed STI structure.
Figure 8:
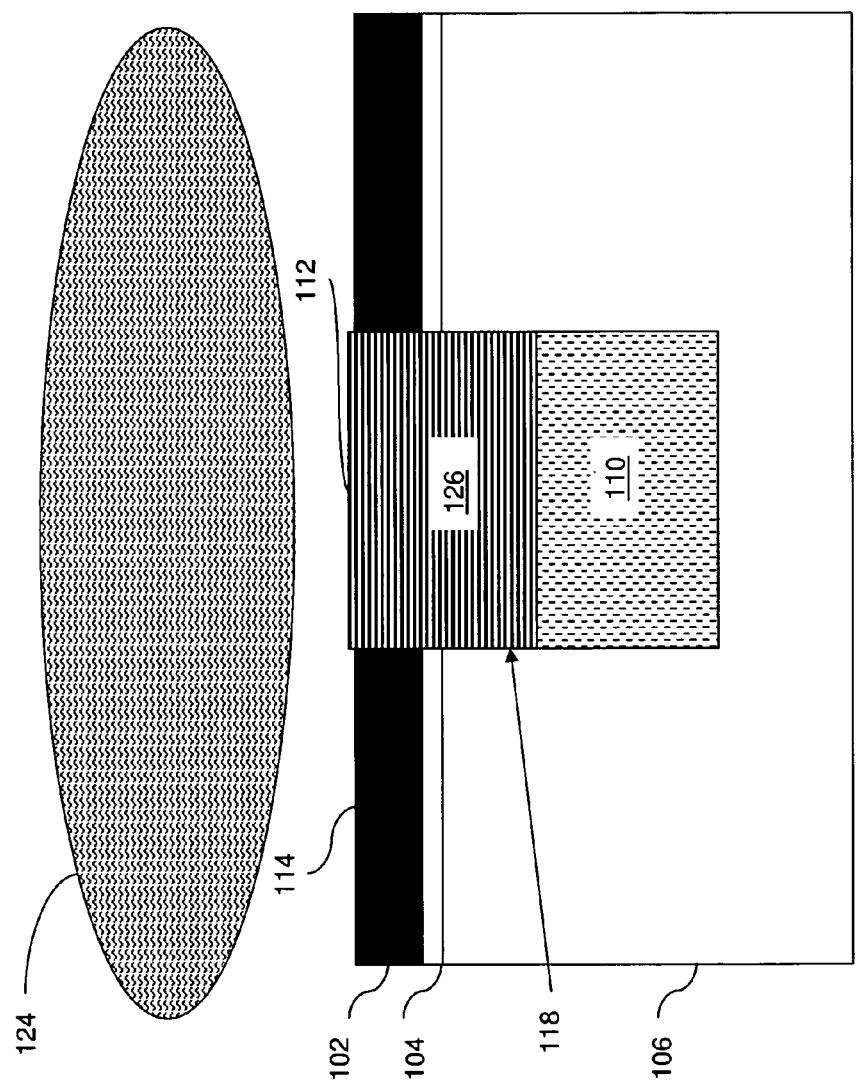
FIG. 8 is a schematic cross-sectional view diagram of a partially completed STI structure.
Figure 11:
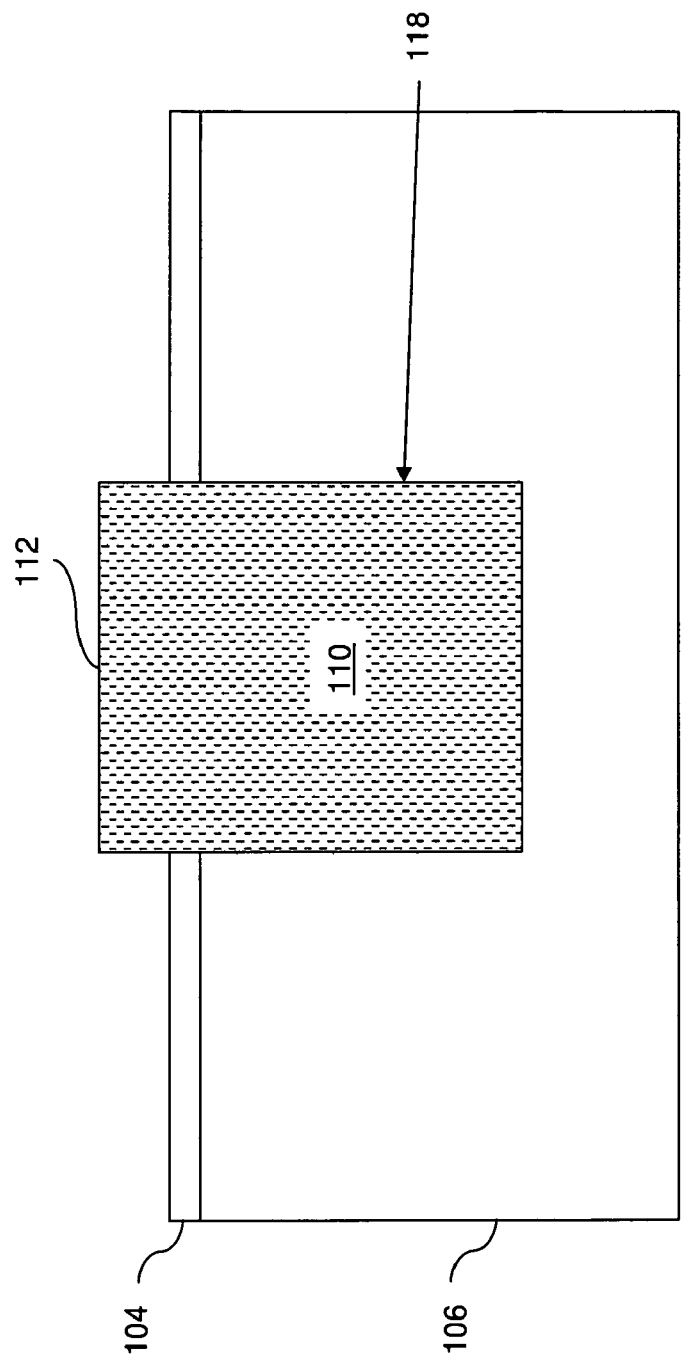
FIG. 11 is a schematic cross-sectional view diagram of a partially completed STI structure.
Figure 12:
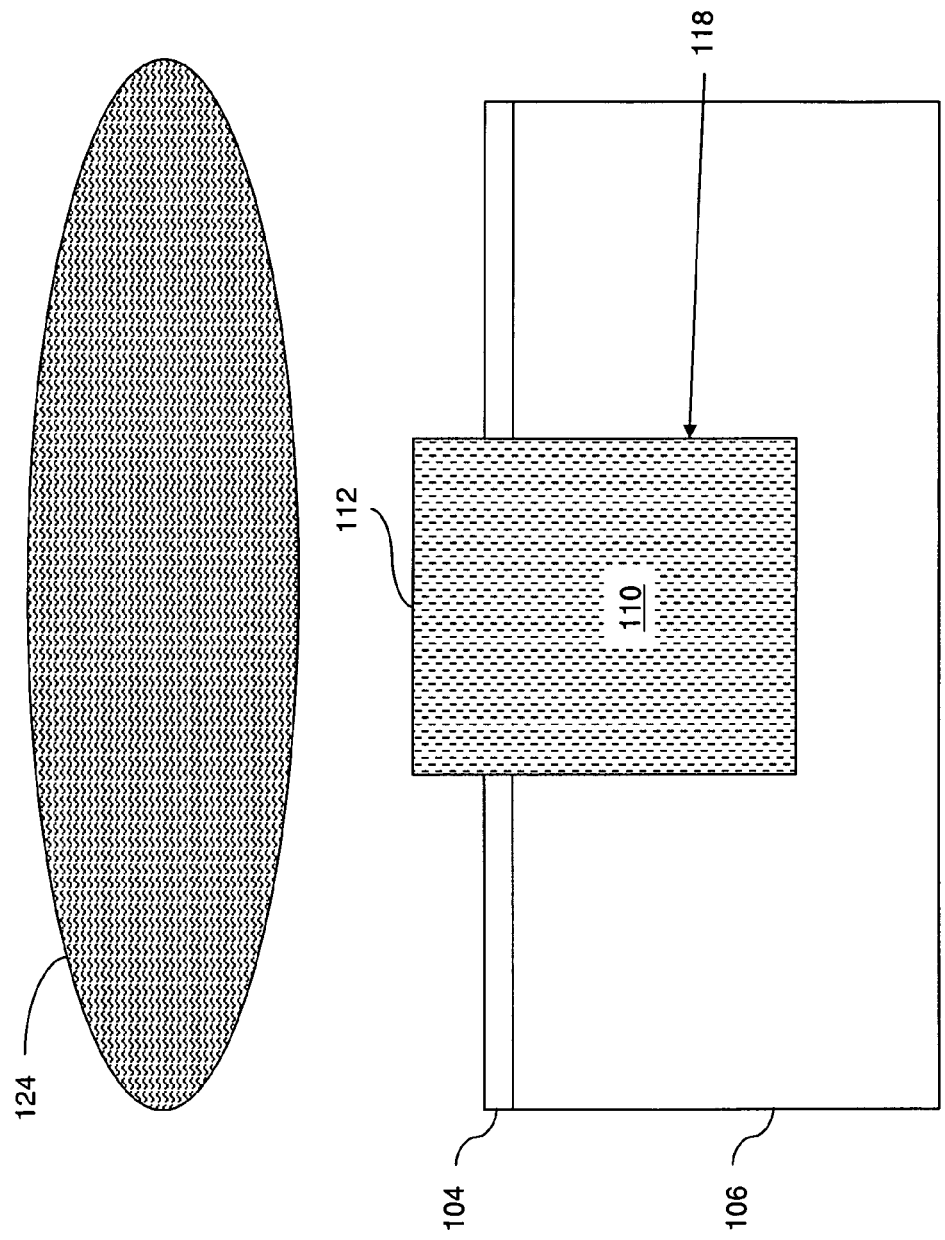
FIG. 12 is a schematic cross-sectional view diagram of a partially completed STI structure.
Figure 13:
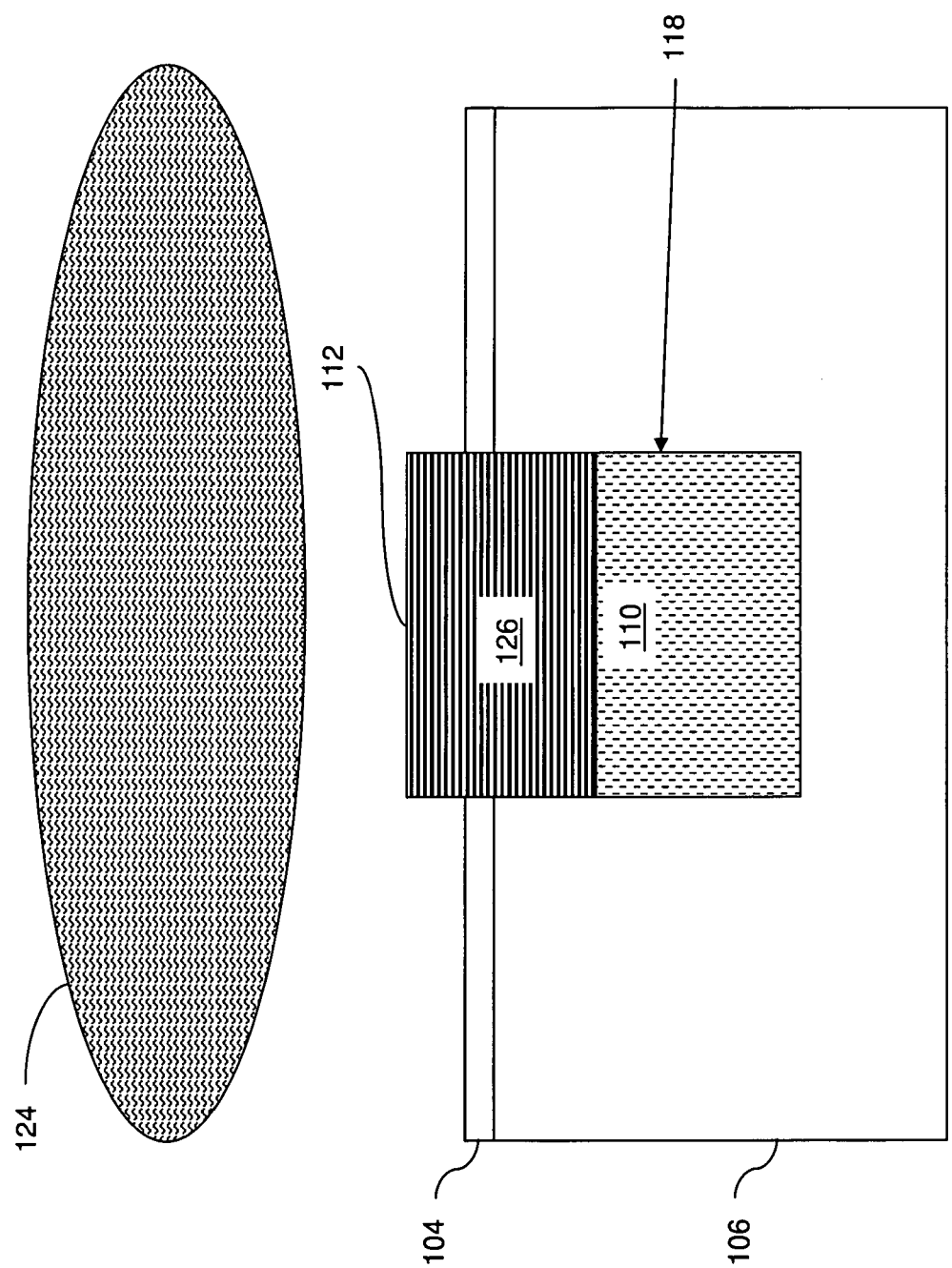
FIG. 13 is a schematic cross-sectional view diagram of a partially completed STI structure.
Figure 14:
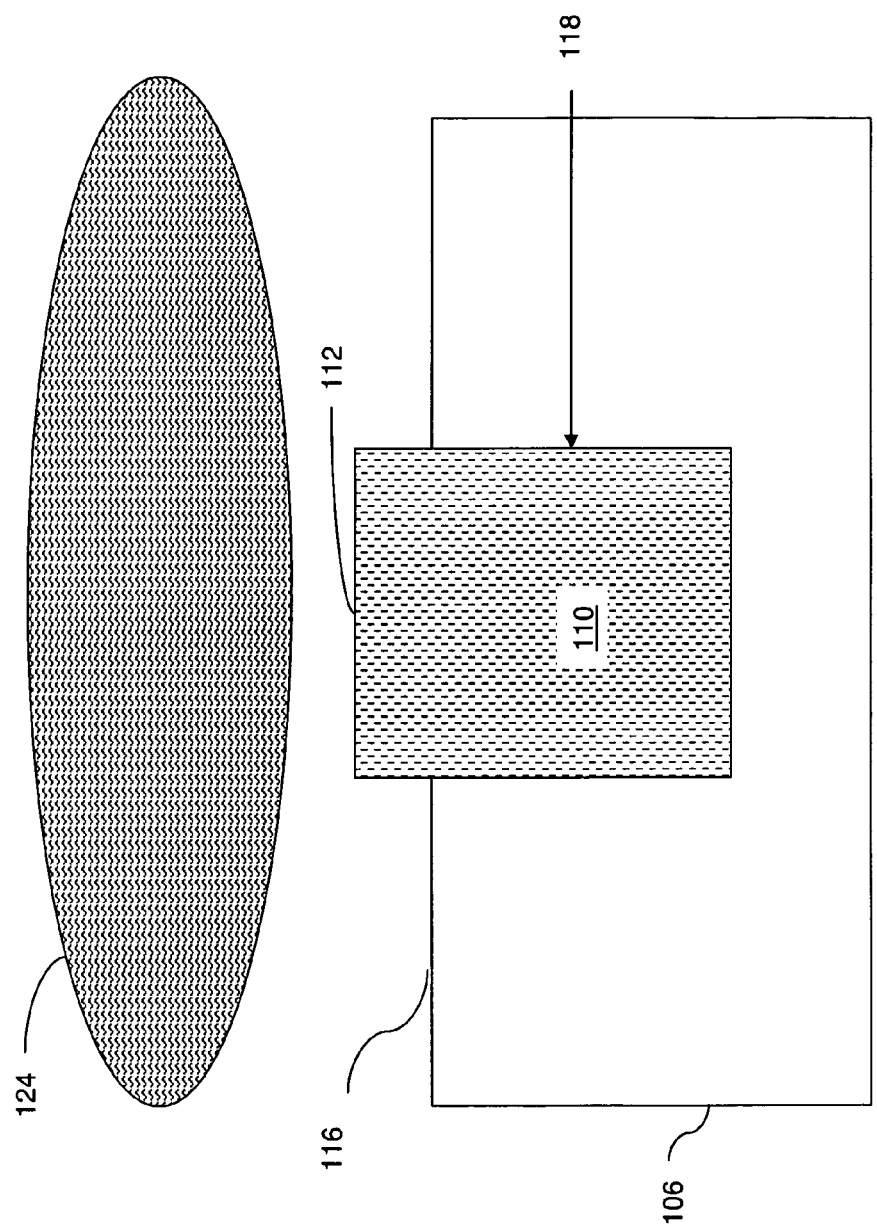
FIG. 14 is a schematic cross-sectional view diagram of a partially completed STI structure.
Figure 15:
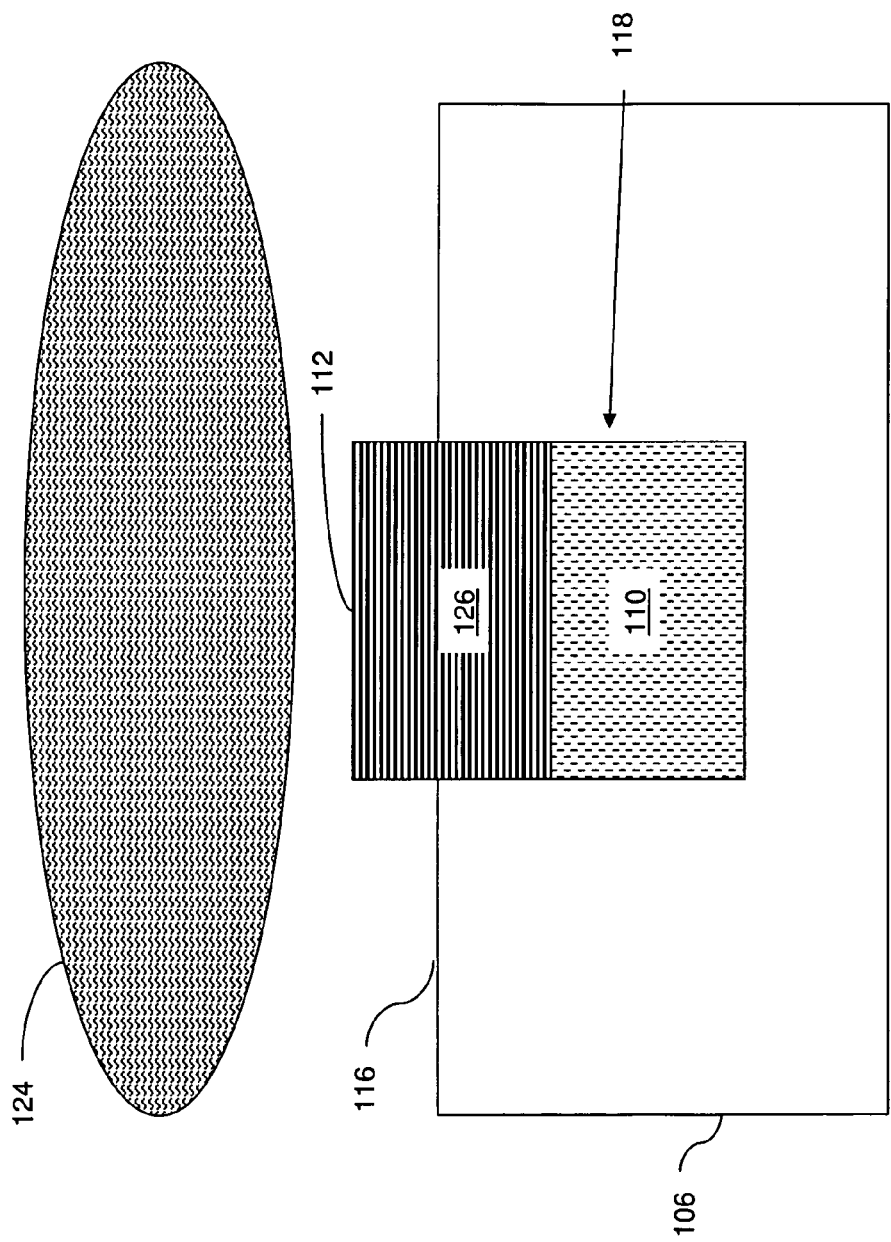
FIG. 15 is a schematic cross-sectional view diagram of a partially completed STI structure.

In one embodiment of forming the completed STI structure 100 of FIG. 10, once the structure of FIG. 3 is formed, a plasma nitridation process 124 can be used to incorporate nitrogen into the upper portion of the STI fill oxide 110 through top surface 112 to convert the upper portion into an oxynitride STI fill top layer 126 (see FIGS. 7-8). The plasma nitridation process 124 is explained in greater detail below. After forming the nitridized STI fill top layer 126, the pad nitride layer 102 is stripped, e.g., by using a hot solution of phosphoric acid, etc., and the pad oxide layer 104 is also stripped, e.g., by using an HF etching process, etc., to form the preliminary STI structure of FIG. 9. Stripping the pad oxide layer 104 provides a clean silicon surface to grow an additional sacrificial pad oxide layer (not shown) which serves to protect the underlying substrate during additional semiconductor device fabrication processes (e.g., through the well formation ion implantation sequences). Alternatively, once the structure of FIG. 3 is formed, the pad nitride 102 can be removed from the pad oxide 104, e.g., by using a hot solution of phosphoric acid, etc., (see FIG. 11). Then, a plasma nitridation process 124 can be applied to the top surface 112 of the STI fill 110 to convert the upper portion of the STI fill oxide 110 into an oxynitride STI fill top layer 126 (see FIGS. 12-13). Once the plasma nitridation process 124 is complete, the pad oxide 104 can be removed from the silicon substrate 106, e.g., by using an HF etching process, etc. (see FIG. 9). Alternatively, once the structure of FIG. 3 is formed, the pad nitride 102 and the pad oxide 104 may be removed (see FIG. 4), as discussed above, prior to subjecting the STI fill oxide 110 to a plasma nitridation process 124 (see FIGS. 14-15 and 9). After the plasma nitridation process 124 is performed, the nitridation process should be completed with a high temperature thermal anneal 127 (see FIG. 9, discussed below) to form the completed STI structure 100 of FIG. 10.

During the plasma nitridation process 124, the upper portion of the STI fill 110 is nitridized through the top surface 112 to a depth such that the thickness (i.e., depth) of the resulting oxynitride STI fill top layer 126 extends above and below the level of the silicon substrate top surface 116. Varying the order of the processes (e.g., plasma nitridation and stripping of the pad nitride 102 and pad oxide 104 layers), may result in a decrease in the height of the STI fill 110 and, thus, effectively increase the depth of the oxynitride STI fill top layer 126 to a greater degree below the level of the silicon substrate top surface 116. For example, in the embodiments in which the plasma nitridation process 124 is performed after the pad nitride layer 102 has been stripped (see FIG. 12 or 14). Stripping the pad nitride 102, will reduce the height of the STI fill 110 relative to the level of the top surface 116 of the silicon substrate 106. Thus, subjecting the STI fill 110 to a plasma nitridation process 124, after the pad nitride layer 102 is stripped, will incorporate more nitrogen into the STI fill 110 below the level of the silicon layer top surface 116. This is particularly advantageous to minimize STI divot 120 formation, as illustrated in FIG. 6, because the nitrogen concentration at the edges of the oxynitride STI fill top layer 126 will reduce the etch rate from HF exposure.

In an embodiment of forming the STI structure 200 of FIG. 18, upon completion of the CMP process forming the structure of FIG. 3, the top surface 112 of the STI fill 110 is subjected to a plasma nitridation process 124 (see FIGS. 7-8) to form an oxynitride STI fill top layer 126 (see FIG. 8) having a thickness that extends both above and below the level of the top surface 116 of the silicon substrate 106. In addition to the plasma nitridation process 124, a thermal nitridation process 128 (e.g., 800 C-1000 C anneal in NO, NH3 or N2O gas) is performed (see FIG. 16). This thermal nitridation process 128 incorporates additional nitrogen into the STI fill margins 117 adjacent the silicon trench walls 118 and, particularly, into the region of the STI fill margins 117 where the silicon dioxide STI fill 110 and the upper edges 119 of the silicon trench walls 118 meet, in order to form oxynitride STI fill corners 130. Due to this thermal nitridation process 128, the oxynitride STI fill corners 130 are thicker and contain a higher concentration of nitrogen relative to the STI fill margins 117 lower in the STI trench 136 because the nitrogen concentration dissipates as the gas flows deeper into the trench 136 (see FIG. 16). Both the oxynitride STI fill top layer 126 and the oxynitride STI fill corners 130 are effective at preventing erosion of the STI fill 110, including the loss of STI fill height 122 and divot 120 formation caused by further processing of the semiconductor device (see FIGS. 5-6). Once the thermal nitridation process 128 is complete, the pad nitride layer 102 and pad oxide layer 104, are stripped away from the silicon substrate 106, as discussed above (see FIG. 18). The sequence of the plasma nitridation process (see FIG. 8) and the thermal nitridation process (see FIG. 16) can be switched without significantly changing the results; however, if plasma nitridation 124 is performed after thermal nitridation 128, an additional high temperature thermal anneal 127 (see FIG. 17) is required to complete plasma nitridation and to remove plasma damages.

As stated above, a plasma nitridation process can be used to nitridize the upper portion of the STI fill 110 through the STI fill top surface 112 to form an oxynitride STI fill top layer 126 of either the STI structure 100 of FIG. 10 or the STI structure 200 of FIG. 18. Plasma nitridation 124 is the preferred nitridation process because this process is capable of adding nitrogen into silicon dioxide to create an oxynitride. Specifically, a property of plasma nitridation is that this nitrogen incorporation can be preferentially placed, such that nitrogen can be incorporated at and near an exposed surface of an oxide (e.g., top surface 112 of STI fill oxide 110) as can be seen in FIG.

Figure 19A:
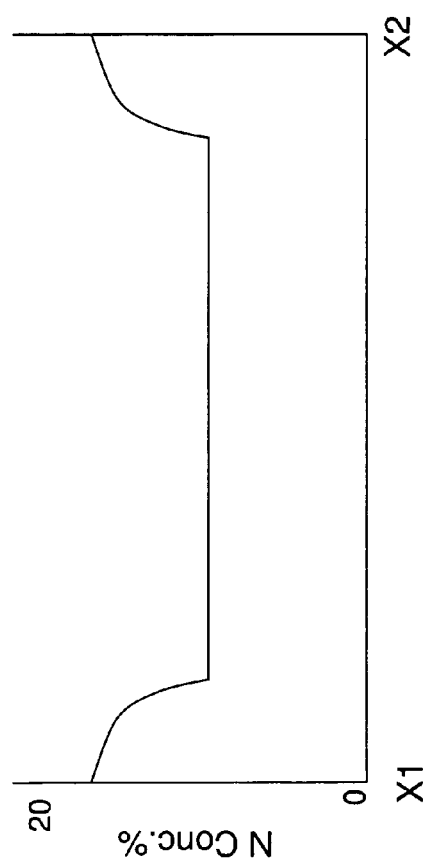
FIG. 19$a$ is a schematic cross-sectional nitrogen concentration profile.
Figure 19B:
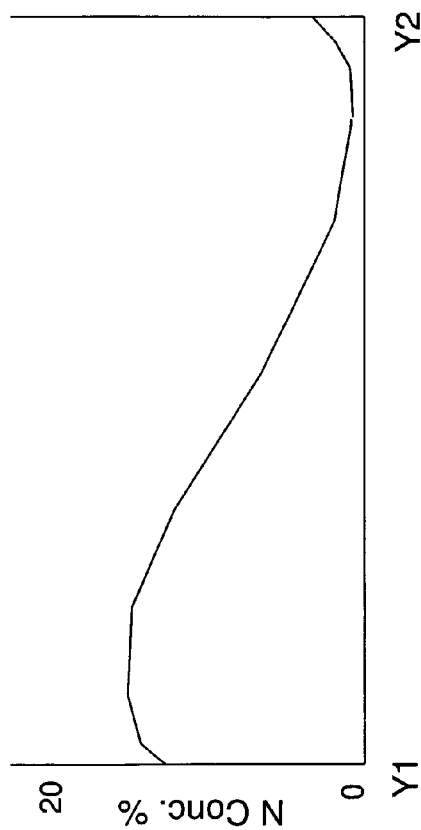

19b. This is in contrast to thermal nitridation techniques 128 which are not able to nitridize exposed oxide surfaces, but instead nitridize the STI fill margins 117 adjacent the silicon trench walls 118 (i.e., the buried surfaces of the STI fill 110 at the Si/SiO$_2$ interfaces as illustrated in FIG. 19a). Si/SiO$_2$ interfaces occur at the junctions between the silicon trench walls 118 and the STI silicon dioxide fill margins 117. The oxynitride STI fill top layer 126 resulting from the plasma nitridation process is more resistant to etching in HF than a pure silicon dioxide fill would be. During the plasma nitridation process 124, the chamber pressure can be held between approximately 5 mtorr and 80 mtorr. The high frequency power can range between approximately 300 watts and 1500 watts. The Nitrogen flow can be set at between approximately 10 standard centimeters cubed per minute (sccm) and 1000 sccm and the Helium flow can be set between approximately 0 sccm and 1000 sccm. The processing time for the plasma nitridation can be approximately 10 and 100 seconds. Varying sources of nitrogen may be used, such as molecular N$_2$, ammonia (NH$_3$), etc.

Also, as stated above, the plasma nitridation process 124 must be immediately followed by a high temperature anneal 127 (see FIGS. 9 and 17), unless it preceeds thermal nitridation 128. The thermal anneal 127 ensures that the nitrogen from the plasma is incorporated into the oxynitride top layer 126 and also anneals out defects created during the plasma process. Specifically, the annealing process 127 is conducted at a temperature between approximately 800° C. and 1100° C. The nitrogen (e.g., N$_2$) flow is set between approximately 1 standard liters per minutes (slm) and 10 slm and/or the oxygen (e.g., O$_2$) flow is set between 1 slm and 10 slm. The chamber pressure is set to range from approximately 50 Torr to 760 Torr. The processing time is between approximately 5 and 600 seconds. The high temperature anneal may be eliminated when the thermal nitridation is performed at temperatures higher 800 C.

Figure 16:
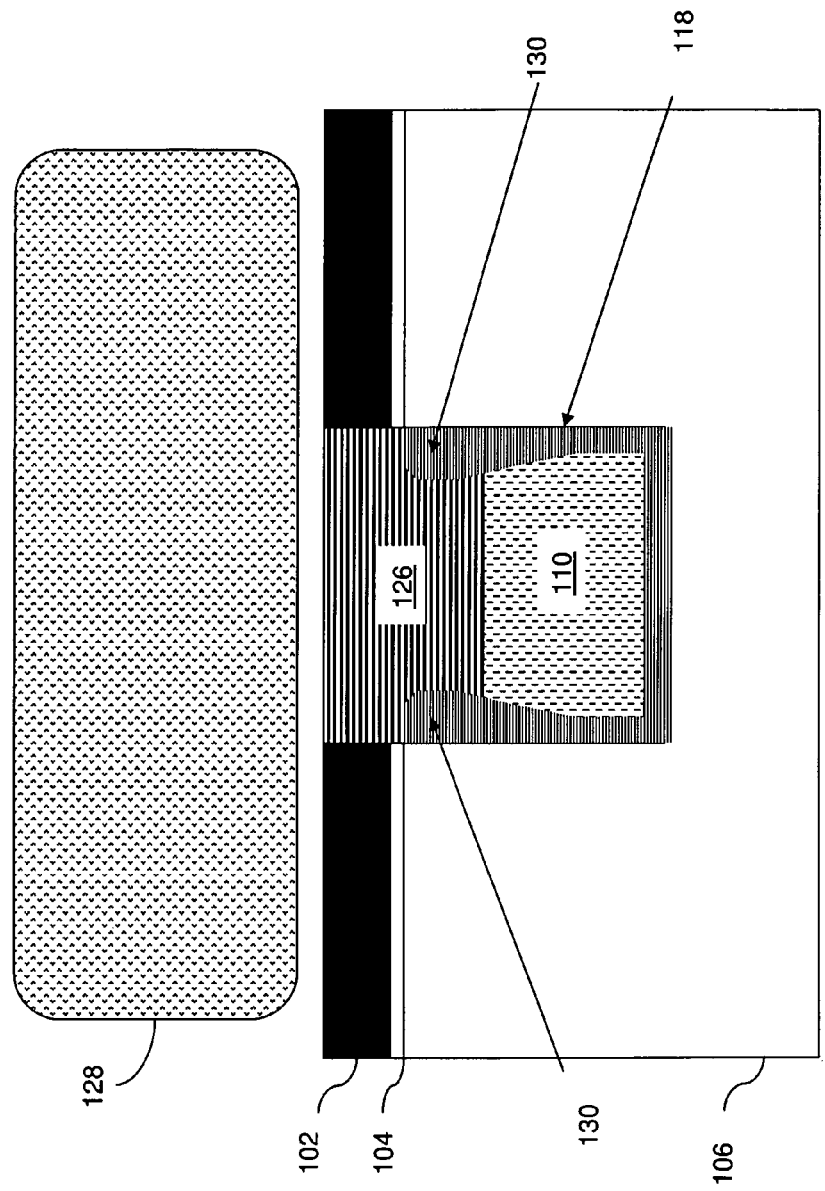
FIG. 16 is a schematic cross-sectional view diagram of a partially completed STI structure.
Figure 17:
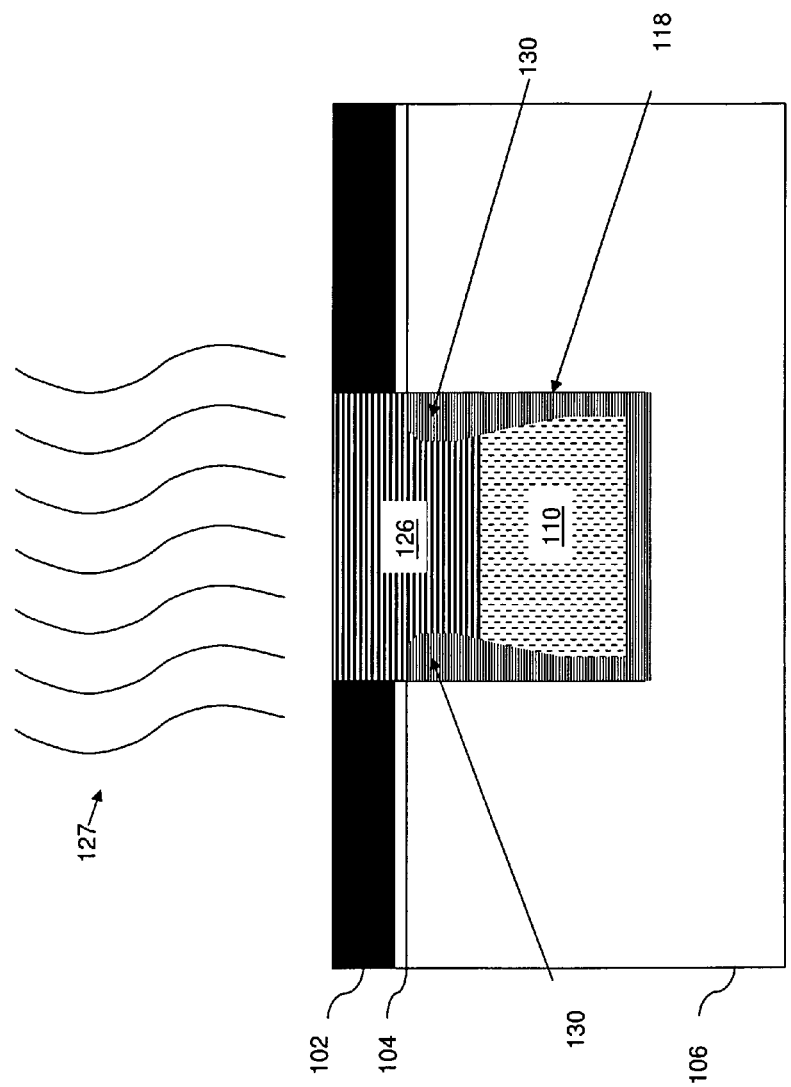
FIG. 17 is a schematic cross-sectional view diagram of a partially completed STI structure.

Also, as stated above, a thermal nitridation process 128 (see FIG. 16) can be used to nitridize the STI fill margins 117 adjacent to the silicon trench walls 118 and particularly, to incorporate additional nitrogen into the region of the STI fill margins 117 where the silicon dioxide STI fill 110 and the upper edges 119 of the silicon trench walls 118 meet in order to form oxynitride STI fill corners 130 of the STI structure 200 of FIG. 18. Specifically, prior to stripping the pad nitride, the STI fill 110 can be treated with a high temperature thermal nitridation in the form of a gas such as NH$_3$, NO or N$_2$O. This thermal nitridation process 128 will convert the STI fill margins 117 adjacent to the silicon trench walls 118 to an oxynitride, as shown in FIG. 16 and FIG. 17a. Due to the thermal nitridation process, the oxynitride STI fill corners 130 are thicker and contain a higher concentration of nitrogen relative to the other regions of STI fill margins 117 lower in the STI trench 136 because the nitrogen concentration dissipates as the gas flows deeper into the trench 136. Combining thermal nitridation 128 with plasma nitridation 124 results in a STI structure, as shown in FIG. 18, with reinforced oxynitride STI fill corners 130 and an oxynitride STI fill top layer 126. The combined oxynitride features 126, 130 are particularly effective in resisting the formation of divots 120 (see FIG. 5). During the thermal nitridation process 128, the STI fill 110 is typically exposed to any one of NH3, NO, N$_2$O or a nitrogen radical species at temperatures ranging between approximately 600° C. and 1100° C. and pressures ranging between approximately 50 Torr and 760 Torr.

Figure 20:
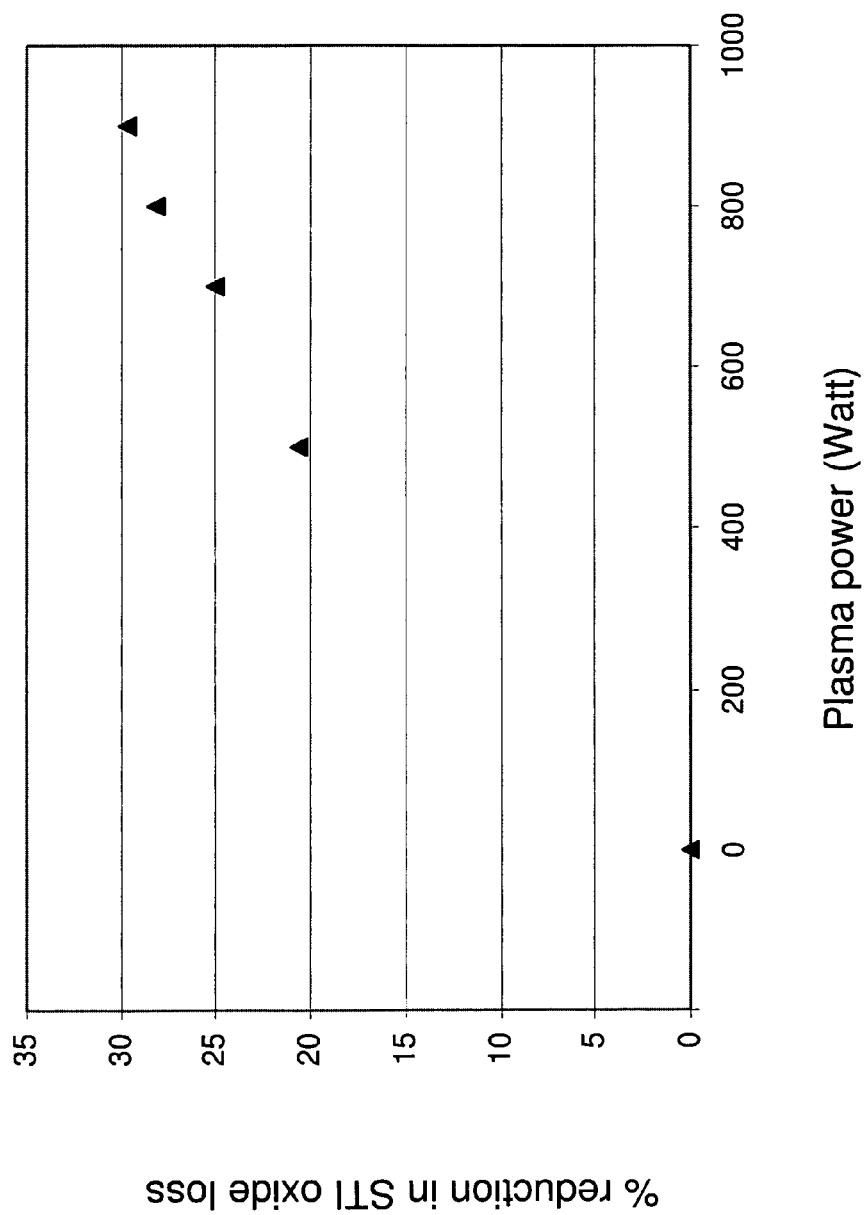
FIG. 20 is graph illustrating percentage of STI oxide fill loss due to HF etching for different STI structures formed using varying Radio Frequency (RF) powers (Watt) for the plasma nitridation process; and, FIGS. 21 and 22 are schematic cross-sectional view diagrams of completed STI structures following HF etching processes.

Referring to FIG. 20, experimental data was collected on STI fill height 122 (i.e., thickness) loss from HF treatment for STI shallow trench isolation structures, as illustrated in FIG. 10, having an oxynitride STI fill top layer 126 that was formed using plasma nitridation treatments of varying plasma powers. Higher plasma power results in an increase in nitrogen concentration within the oxynitride STI fill top layer 126 and, thereby, reduces the percentage of STI fill loss due to the HF etching process. Thus, increasing the concentration of nitrogen incorporated into the upper portion of the STI fill oxide 110 through the top surface 112, creates a more etch resistant oxynitride STI fill top layer 126 and reduces the rate of STI fill height loss. For example, the divot 120 caused by an HF etching process in a nitrided STI fill top layer 126, as illustrated in FIG. 21, is substantially less pronounced and does not go below the level of the top surface 116 of the silicon substrate 106, as compared to the divot 120 of the non-nitrided STI fill of FIG. 5. Similarly, the height 122 of an STI fill 110 of an STI structure 200 as illustrated in FIG. 22, having an oxynitride STI fill top layer 126 formed by plasma nitridation and oxynitride STI fill corners 130 formed by thermal nitridation, after being subjected to an HF etching process is significantly greater than that of the non-nitrided STI fill 110 of FIG. 6. More particularly, the height loss of the STI fill 110, as illustrated in FIG. 22, does not reduce the level of the top surface 112 of the STI fill 110 to below the top surface 116 of the silicon substrate 106.

In addition to the method embodiments described above, plasma and/or thermal nitridation processes can be performed at different stages in the semiconductor device fabrication process, such as after the polysilicon gate has been patterned, to reduce the HF etch rate.

Therefore, shallow trench isolation (STI) structures for a semiconductor device and a method for forming the STI structures are disclosed. The STI structures incorporate an STI oxynitride top layer and, optionally, oxynitride STI fill corners in the region of the STI margins adjacent the upper edges of the silicon trench walls. Oxynitrides, so positioned, limit the STI fill height loss and also, reduce the formation of divots in the STI fill below the level of the silicon substrate, caused by HF etching and other fabrication process. Limiting STI fill height loss and the formation of divots improves the functions of the STI structure. In order to keep fabrication costs low, the method of forming the STI structure disclosed herein is particularly compatible with standard semiconductor device fabrication processes, including chemical mechanical polishing (CMP), because it incorporates the use of a pure silicon dioxide STI fill and a plasma nitridation process to incorporate nitrogen into the top layer of the STI fill. While the invention has been described in terms of embodiments, those skilled in the art will recognize that the invention can be practiced with modification within the spirit and scope of the appended claims.

What is claimed is:

1. A method of forming a semiconductor trench isolation structure, comprising:
    forming a trench extending through at least one pad layer into a semiconductor substrate;
    completely filling said trench with a single layer of silicon dioxide; and,
    forming an oxynitride upper portion within said single layer of silicon dioxide above an oxide lower portion such that said oxynitride upper portion extends from a top surface of said single layer adjacent to said at least one pad layer to below a level of a top surface of said silicon substrate.

2. The method of claim 1, wherein said forming of said oxynitride upper portion comprises performing a plasma nitridation process.

3. The method of claim 2, wherein said forming of said oxynitride upper portion further comprises performing a thermal anneal after said plasma nitridation process.

4. The method of claim 1,
wherein said trench comprises a silicon trench wall having an upper edge abutting said at least one pad layer, and,
wherein said method further comprises forming an oxynitride margin within said single layer of said silicon dioxide such that said oxynitride margin extends from a bottom surface of said trench along said silicon trench wall to said upper edge.

5. The method of claim 4, wherein said forming of said oxynitride margin comprises performing a thermal nitridation process to incorporate nitrogen into said single layer of silicon dioxide along said silicon trench wall such that an upper region of said oxynitride margin adjacent to said upper edge of said silicon trench wall is relatively thicker and has a relatively higher concentration of nitrogen than a lower region of said oxynitride margin and further such that, when combined in sequence with said forming of said oxynitride upper portion, said upper region of said oxynitride margin overlaps with said oxynitride upper portion so as to form an oxynitride corner that is relatively thicker and has a relatively higher concentration of nitrogen as compared to any other portion of said single layer.

6. The method of claim 1,
wherein said at least one pad layer comprises a pad oxide layer on said silicon substrate and a pad nitride layer on said pad oxide layer; and,
wherein said method further comprises, after said forming of said oxynitride upper portion, removing said pad nitride layer and said pad oxide layer.

7. The method of claim 1,
wherein said at least one pad layer comprises a pad oxide layer on said silicon substrate and a pad nitride layer on said pad oxide layer; and,
wherein said method further comprises: before
before said forming of said oxynitride upper portion, removing said pad nitride layer; and
after said forming of said oxynidride upper portion, removing said pad oxide layer.

8. The method of claim 1,
wherein said at least one pad layer comprises a pad oxide layer on said silicon substrate and a pad nitride layer on said pad oxide layer; and,
wherein said method further comprises removing said pad nitride layer and said pad oxide layer, before said forming of said oxynitride upper portion.

9. A method of forming a semiconductor trench isolation structure, comprising:
forming a trench extending through at least one pad layer into a silicon substrate such that said trench has a silicon trench wall having an upper edge abutting said at least one pad layer;
completely filling said trench with a single layer of silicon dioxide;
performing a planarization process to expose said at least one pad layer;
after said performing of said planarization process, performing a plasma nitridation process so as to form an oxynitride upper portion within said single layer of silicon dioxide above an oxide lower portion such that said oxynitride upper portion extends from a top surface of said single layer adjacent to said at least one pad layer to below a level of a top surface of said silicon substrate; and,
after said performing of said planarization process, performing a thermal nitridation process so as to form an oxynitride margin within said single layer of said silicon dioxide such that said oxynitride margin extends from a bottom surface of said trench along said silicon trench wall to said upper edge
wherein said thermal nitridation process is performed so that an upper region of said oxynitride margin adjacent to said upper edge of said silicon trench wall is relatively thicker and has a relatively higher concentration of nitrogen than a lower region of said oxynitride margin and further such that, when combined in sequence with said performing of said plasma nitridation process, said upper region of said oxynitride margin overlaps with said oxynitride upper portion so as to form an oxynitride corner that is relatively thicker and has a relatively higher concentration of nitrogen as compared to any other portion of said single layer.

10. The method of claim 9, wherein if said performing of said plasma nitridation process occurs after said performing of said thermal nitridation process, then said forming of said oxynitride top layer further comprises performing a thermal anneal.

11. The method of claim 9, wherein said at least one pad layer comprises a pad oxide layer on said silicon substrate and a pad nitride layer on said pad oxide layer; and,
wherein said method further comprises stripping said pad nitride layer and said pad oxide layer off said silicon substrate after said forming of said oxynitride corners.

* * * * *